United States Patent
Lee et al.

(10) Patent No.: US 11,186,771 B2
(45) Date of Patent: Nov. 30, 2021

(54) ETCHING SOLUTION FOR SELECTIVELY REMOVING SILICON NITRIDE DURING MANUFACTURE OF A SEMICONDUCTOR DEVICE

(71) Applicant: Versum Materials US, LLC, Tempe, AZ (US)

(72) Inventors: Yi-Chia Lee, Hsin Chu (TW); Wen Dar Liu, Hsin Chu (TW)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/990,000

(22) Filed: May 25, 2018

(65) Prior Publication Data

US 2018/0346811 A1 Dec. 6, 2018

Related U.S. Application Data

(60) Provisional application No. 62/515,351, filed on Jun. 5, 2017.

(51) Int. Cl.
| | |
|---|---|
| *C09K 13/06* | (2006.01) |
| *H01L 21/311* | (2006.01) |
| *C09K 13/00* | (2006.01) |
| *C23F 1/44* | (2006.01) |
| *H01L 21/465* | (2006.01) |
| *C03C 25/68* | (2006.01) |
| *C23F 1/00* | (2006.01) |
| *C23F 1/10* | (2006.01) |
| *H01L 21/306* | (2006.01) |

(52) U.S. Cl.
CPC .............. *C09K 13/06* (2013.01); *C03C 25/68* (2013.01); *C09K 13/00* (2013.01); *C23F 1/00* (2013.01); *C23F 1/10* (2013.01); *C23F 1/44* (2013.01); *H01L 21/30608* (2013.01); *H01L 21/31111* (2013.01); *H01L 21/465* (2013.01)

(58) Field of Classification Search
None
See application file for complete search history.

(56) References Cited

U.S. PATENT DOCUMENTS

| | | | |
|---|---|---|---|
| 4,373,656 | A | 2/1983 | Parker, Jr. et al. |
| 5,472,562 | A | 12/1995 | Ziger |

(Continued)

FOREIGN PATENT DOCUMENTS

| | | | |
|---|---|---|---|
| JP | 4945452 | B | 12/1974 |
| JP | 5640682 | B | 9/1981 |

(Continued)

OTHER PUBLICATIONS

Watanabe, Daisuke, et al. "High selectivity (SiN/SiO2) etching using an organic solution containing anhydrous HF," Microelectronic Engineering, 86 (2009), pp. 2161-2164.

(Continued)

*Primary Examiner* — Stephanie P Duclair
(74) *Attorney, Agent, or Firm* — William T. Slaven, IV (57) ABSTRACT

Described herein is an etching solution comprising water, phosphoric acid solution (aqueous), and a hydroxyl group-containing solvent. Such compositions are useful for the selective removal of silicon nitride over silicon oxide from a microelectronic device having such material(s) thereon during its manufacture.

16 Claims, 3 Drawing Sheets

(56) References Cited

U.S. PATENT DOCUMENTS

| | | | |
|---|---|---|---|
| 6,303,514 | B1 | 10/2001 | Hackett et al. |
| 8,940,182 | B2 | 1/2015 | Hong et al. |
| 2004/0242019 | A1* | 12/2004 | Klein ................ H01L 31/02168 438/757 |
| 2008/0200036 | A1 | 8/2008 | Stockum et al. |
| 2010/0176082 | A1* | 7/2010 | Cooper .................. C09K 13/08 216/13 |
| 2012/0289056 | A1* | 11/2012 | Bergman ................ C09K 13/04 438/757 |
| 2013/0065400 | A1 | 3/2013 | Yoshimizu et al. |
| 2014/0235064 | A1* | 8/2014 | Matsui .............. H01L 21/31111 438/753 |
| 2016/0017224 | A1* | 1/2016 | Lee .................... H01L 21/0214 438/706 |
| 2017/0145311 | A1* | 5/2017 | Liu .................. H01L 21/30608 |

FOREIGN PATENT DOCUMENTS

| | | |
|---|---|---|
| JP | 2012018983 A2 | 7/2012 |
| KR | 20170009240 A | 1/2017 |
| KR | 20170059170 A | 5/2017 |
| WO | 2012174518 | 12/2012 |

OTHER PUBLICATIONS

Bermudez, V. M., "Wet-Chemical Treatment of Si3N4 Surfaces Studied Using Infrared Attenuated Total Reflection Spectroscopy", Journal of The Electrochemical Society, 152 (2), pp. F31-F36 (2005).

Microtech Systems, Inc., "Phosphoric Acid Nitride Removal," MT Systems 2007, pp. 1-9.

Seo, Dongwan, et al., "Selective wet etching of Si3N4/SiO2 in phosphoric acid with the addition of fluoride and silicic compounds," Microelectronic Engineering, 118, (2014) pp. 66-71.

Garnier, P., et al., "Selective Silicon Nitride Etch with Hot Diluted H—an Alternative to Orthophosphoric Acid," ECS Transactions, 69 (8) pp. 169-175 (2015).

Shrestha, Nabeen K., et al., "Self-organization and zinc doping of Ga2O3 nanoporous architecture: A potential nano-photogenerator for hydrogen," Electrochemistry Communications, 35 (2013) pp. 112-115.

* cited by examiner

ETCHING SOLUTION FOR SELECTIVELY REMOVING SILICON NITRIDE DURING MANUFACTURE OF A SEMICONDUCTOR DEVICE

CROSS-REFERENCE TO RELATED APPLICATIONS

This application claim priority under 35 U.S.C. § 119(e) to U.S. provisional patent application No. 62/515,351, filed on Jun. 5, 2017, the entirety of which is incorporated herein by reference.

BACKGROUND OF THE INVENTION

The present invention relates to aqueous phosphoric acid etching solutions used in the manufacture of semiconductor devices. More specifically, the invention provides an aqueous phosphoric acid etching solution that exhibits increased etch selectivity of silicon nitride films over silicon dioxide films in silicon nitride-silicon oxide composite semiconductor devices.

Silicon nitride is widely used in the semiconductor industry as a barrier or top layer to prevent diffusion of contaminates into the semiconductor device. It is also used as a selective oxidation barrier in the Localized Oxidation of Silicon (LOCOS) process to allow oxidation to occur in required areas to provide transistor isolation. Silicon nitride is essentially inert, dense and difficult to etch. Hydrofluoric acid and buffered oxide etchants can be used but etch rates are generally slow even at high temperatures and a photoresist is often adversely effected by extreme etching conditions. Another problem is that when phosphoric acid is used in the etching solution the phosphoric acid etches both the silicon dioxide and the silicon nitride. This co-etching is undesirable when the selective etching of silicon nitride is required. U.S. Pat. No. 5,472,562, for example, teaches that the addition of a soluble silicon compound to an etching solution of phosphoric acid, hydrofluoric acid and nitric acid will aid in the selectivity of silicon nitride etching with respect to silicon and silicon dioxide. However, the presence of the additional hydrofluoric acid and nitric acid is undesirable and in many cases detrimental to the semiconductor process. Other processes disclosed in the art provide stripping compositions which have silicon added to modify the etching characteristics of the composition. Typically, this may be accomplished by adding a solid silicon containing material such as a silicon wafer to a heated phosphoric acid solution. This process is undesirable because of the length of time required to digest the silicon wafer and the presence of undissolved particles in the etching solution. Moreover, a heated process comes with its own set of concerns such as the need for special equipment to contain vapors. Thus, there is still a need in the art for an improved etch solutions that have high selectivity for SiN over $SiO_2$.

BRIEF SUMMARY OF THE INVENTION

In one aspect, the present invention provides an etching solution suitable for the selective removal of silicon nitride over silicon oxide from a microelectronic device, which comprises: water; phosphoric acid solution (aqueous); and a hydroxyl group-containing solvent, which may be water-miscible (or water soluble) solvent. The etching solution may optionally comprise surfactants, for example, non-ionic surfactants.

In another aspect, the present invention provides methods of selectively enhancing the etch rate of silicon nitride relative to silicon dioxide on a composite semiconductor device comprising silicon nitride and silicon dioxide, the method comprising the steps of: contacting the composite semiconductor device comprising silicon nitride and silicon dioxide with an aqueous composition comprising phosphoric acid and a hydroxyl group-containing solvent; and rinsing the composite semiconductor device after the silicon nitride is at least partially removed, wherein the selectivity of the etch for silicon nitride over silicon oxide is from about 50 to about 500 or higher or from about 200 to about 500.

The embodiments of the invention can be used alone or in combinations with each other.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the more narrow language of "consisting essentially of" and "consisting of".

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the selective removal of silicon nitride over silicon oxide from a microelectronic device having such material(s) thereon during its manufacture.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 0.001 wt. %. "Substantially free" also includes 0.000 wt. %. The term "free of" means 0.000 wt. %.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In the broad practice of this aspect, the etching solution of the present development comprises, consists essentially of, or consists of water, phosphoric acid, and a hydroxyl group-containing solvent.

In some embodiments, the etching solution compositions disclosed herein are formulated to be substantially free of at least one of the following chemical compounds: hydrogen peroxide and other peroxides, ammonium ions, fluoride ions, and abrasives.

In other embodiments, the etching solution compositions disclosed herein are formulated to be free of at least one of the following chemical compounds: hydrogen peroxide and other peroxides, ammonium ions, fluoride ions, and abrasives. The compositions of this invention may be free of at least one of the following chemical compounds: sulfuric acid, hydrofluoric acid, hexafluorosilicic acid, ammonium fluoride, hydrochloric acid, nitric acid. In some compositions of this invention the only inorganic anion present in the composition is the phosphoric ion.

Water

The etching compositions of the present development are aqueous-based and, thus, comprise water. In the present invention, water functions in various ways such as, for example, to dissolve one or more components of the composition, as a carrier of the components, as an aid in the removal of residue, as a viscosity modifier of the composition, and as a diluent. Preferably, the water employed in the cleaning composition is de-ionized (DI) water.

It is believed that, for most applications, the weight percent of water in the composition will be present in a range with start and end points selected from the following group of numbers: 0.5, 1, 5, 10, 15, 20, 25, 30, 40 and 60. Examples of the ranges of water that may be used in the composition include, for examples, from about 0.5% to about 60% by wt., or 1% to about 60% by wt. of water; or from about 0.5% to about 40% by wt., or from about 1% to about 25% by wt., or from about 1% to about 20% by wt., or from about 1% to about 15% by wt.; or from about 5% to about 20% by wt.; or from 5 to about 15% by wt. of water. Still other preferred embodiments of the present invention may include water in an amount to achieve the desired weight percent of the other ingredients.

Phosphoric Acid

The etching compositions of the present invention comprise phosphoric acid. The phosphoric acid functions primarily to etch silicon nitride. Commercial grade phosphoric acid can be used. Typically, the commercially available phosphoric acid is available as 80% to 85% aqueous solutions; however, the amounts of phosphoric acid described and claimed herein are based on a neat solution. In a preferred embodiment electronic grade phosphoric acid solutions are employed wherein such electronic grade solutions typically have a particle count below 100 particles/ml, and wherein the size of the particles is less than or equal to 0.5 microns and metallic ions are present in the acid in the low parts per million to parts per billion level per liter. No other acids such as hydrofluoric acid, nitric acid or mixtures thereof are added to the solution of the present invention.

It is believed that, for most applications, the amount of phosphoric acid will comprise from about 40% to about 99% by weight, or from about 50% to about 95% by weight, or from about 60% to about 90% by weight, or from about 70% to about 90% by weight, or from 80% to about 90% by weight of the composition or any other wt % range based on the total weight of the composition having start and end points selected from: 40, 50, 60, 70, 80, 90, 95 and 99.

Hydroxyl Group-Containing Solvent

The etching compositions of the present invention comprise a hydroxyl group-containing solvent. The hydroxyl group-containing solvent functions primarily to protect the silicon oxide such that the silicon nitride is etched preferentially and selectively. The solvents used in this invention may be water-miscible.

Classes of hydroxyl group-containing solvents include, but are not limited to, alkane diols and polyols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of water soluble alkane diols and polyols such as ($C_2$-$C_{20}$) alkanediols and ($C_3$-$C_{20}$) alkanetriols including, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of water soluble alkylene glycols include, but are not limited to, ethylene glycol, propylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether and ethylene glycol monobenzyl ether, diethylene glycol monobenzyl ether.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to allyl alcohol, propargyl alcohol, 2-butenyl alcohol, 3-butenyl alcohol, and 4-penten-2-ol.

Examples of water soluble, low molecular weight alcohols containing a ring structure include, but are not limited to, alpha-terpineol, tetrahydrofurfuryl alcohol, furfuryl alcohol, and 1,3-cyclopentanediol.

It is believed that, for most applications, the weight percent of hydroxyl group-containing solvent in the composition may be in a range having start and end points selected from the following list of weight percents: 0.5, 1, 5, 7, 12, 15, 20, 30, 35, 40, 50, 59.5. Examples of such ranges of solvent include from about 0.5% to about 59.5% by weight; or from about 1% to about 50% by weight; or from about 1% to about 40% by weight; or from about 0.5% to about 30% by weight; or from about 1% to about 30% by weight; or from about 5% to about 30% by weight; or from about 5% to about 15% by weight; or from about 7% to about 12% by weight of the composition.

Surfactants (Optional)

The compositions of the present invention optionally comprise at least one surfactant. Surfactants for use in the compositions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31 R1, Pluronic L61, Pluronic F-127), polyoxypropylene sucrose ether (SN0085, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100).

Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl) pyridinium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride (C(NH2)3Cl) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel).

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly (acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant comprises dodecylbenzene sulfonic acid, dodecyl phosphonic acid, dodecyl phosphate, TRITON X-100, SOKALAN CP10S, PEG 400, and PLURONIC F-127.

When present, the amount of surfactant may be in a range from about 0.001 wt % to about 1 wt %, preferably about 0.1 wt % to about 1 wt %, based on the total weight of the concentrate. Alternatively, it is believed that for some applications, if present, the one or more surfactants will comprise from about 0.1 wt. % to about 15 wt. % of the composition; or from about 0.1 wt. % to about 10 wt. %, or from about 0.5 wt. % to about 5 wt. %, or from about 0.1 wt. % to about 1 wt. %, or about 0.5 wt. % to about 5 wt. % of the composition. In alternative embodiments the weight percent of surfactant in the composition, based on the total weight of the composition may be within any range having start and end points selected from the following: 0.1, 0.5, 1, 5, 10 and 15.

In some embodiments the compositions of this invention will be free of or substantially free of any or all of the above-listed surfactants.

Corrosion Inhibitor (Optional)

The compositions of the present invention optionally comprise at least one corrosion inhibitor. Corrosion inhibitors serve to react with any metal exposed on the substrate surface being etched, particularly copper, or a nonmetal, to passivate the surface and prevent excessive etching during cleaning.

Any corrosion inhibitor known in the art for similar applications may be used. Examples of corrosion-inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, t-butyl catechol, L-ascorbic acid, vanillin, salicylic acid, diethyl hydroxylamine, and poly(ethyleneimine).

In other embodiments, the corrosion inhibitor is a triazole and is at least one of benzotriazole, o-tolyltriazole, m-tolyltriazole, and p-tolyltriazole.

It is believed that for most applications, if present the corrosion-inhibitor will comprise from about 0.1 wt. % to about 15 wt. % of the composition; preferably it comprises from about 0.1 wt. % to about 10 wt. %, preferably, from about 0.5 wt. % to about 5 wt. %, and most preferably, from about 0.1 wt. % to about 1 wt. % or about 0.5 wt. % to about 5 wt. % of the composition.

In some embodiments the compositions of this invention will be free of or substantially free of any or all of the above-listed corrosion inhibitors.

Other Optional Ingredients The etching composition of the present invention may also include one or more of the following additives: chelating agents, chemical modifiers, dyes, biocides, and other additives. The additive(s) may be added to the extent that they do not adversely affect the performance of the composition.

Another optional ingredient that can be used in the etching composition is a metal chelating agent; it can function to increase the capacity of the composition to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N', N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that the chelating agent, if present, will be in the composition in an amount of from about 0.1 wt. % to about 10 wt. %, preferably in an amount of from about 0.5 wt. % to about 5 wt. % of the composition.

In some embodiments the compositions of this invention will be free of or substantially free of any or all of the above-listed chelating agents added to the composition.

Other commonly known components such as dyes, biocides etc. can be included in the cleaning composition in conventional amounts, for example, amounts up to a total of about 5 weight % of the composition.

Other commonly known components such as dyes, biocides etc. can be included in the cleaning composition in conventional amounts, for example, amounts up to a total of about 5 weight % of the composition.

The etching solution composition of the present invention is typically prepared by mixing the components together in a vessel at room temperature until all solids have dissolved in the aqueous-based medium.

Method

In another aspect there is provided a method for selectively enhancing the etch rate of silicon nitride relative to silicon dioxide in a composite semiconductor device comprising silicon nitride and silicon dioxide by etching the composite semiconductor device in a composition comprising, consisting essentially of, or consisting of phosphoric acid and a hydroxyl group-containing solvent. The method comprises the steps of contacting the composite semiconductor device comprising silicon nitride and silicon dioxide with the composition comprising, consisting essentially of, or consisting of phosphoric acid and a hydroxyl group-containing solvent; and rinsing the composite semiconductor device after the silicon nitride is at least partially removed. An additional drying step may also be included in the method. "At least partially removed" means removal of at least 50% of the material, preferably at least 70% removal. Most preferably, at least 80% removal using the compositions of the present development.

The contacting step can be carried out by any suitable means such as, for example, immersion, spray, or via a single wafer process. The temperature of the composition during the contacting step is preferably from about 100 to 200° C. and more preferably from about 150 to 180° C.

In preferred embodiments, the etch selectivity observed with the composition of the present invention is from about 50 to 500 or more, more preferably from about 100 to 500, and most preferably from about 125 to 500.

After the contacting step is an optional rinsing step. The rinsing step may be carried out by any suitable means, for example, rinsing the substrate with de-ionized water by immersion or spray techniques. In preferred embodiments, the rinsing step may be carried out employing a mixture of de-ionized water and a organic solvent such as, for example, isopropyl alcohol.

After the contacting step and the optional rinsing step is an optional drying step that is carried out by any suitable means, for example, isopropyl alcohol (IPA) vapor drying, heat, or by centripetal force.

The features and advantages are more fully shown by the illustrative examples discussed below.

EXAMPLES

General Procedure for Preparing the Cleaning Compositions

All compositions which are the subject of the present Examples were prepared by mixing the components in a 250 mL beaker with a 1" Teflon-coated stir bar. Typically, the first material added to the beaker was deionized (DI) water. Phosphoric acid is typically added next followed by the hydroxyl-containing solvent.

Compositions of the Substrate

Each test 20 mm by 20 mm coupon employed in the present examples comprised a layer of silicon nitride, $Si_3N_4$, on a silicon substrate. Comparative Examples comprised a layer of silicon oxide, $SiO_2$, on a silicon substrate.

Processing Conditions

Etching tests were run using 100 g of the etching compositions in a 250 ml beaker with a ½" round Teflon stir bar set at 400 rpm. The etching compositions were heated to a temperature of about 160° C. on a hot plate. The test coupons were immersed in the compositions for about 20 minutes while stirring.

The segments were then rinsed for 3 minutes in a DI water bath or spray and subsequently dried using filtered nitrogen. The silicon nitride and silicon oxide etch rates were estimated from changes in the thickness before and after etching and was measured by spectroscopic ellipsometry (MG-1000, Nano-View Co., Ltd., South Korea). Typical starting layer thickness was 4395 Å for $Si_3N_4$ and 229 Å for $SiO_2$.

Example Set 1

Figure 1:
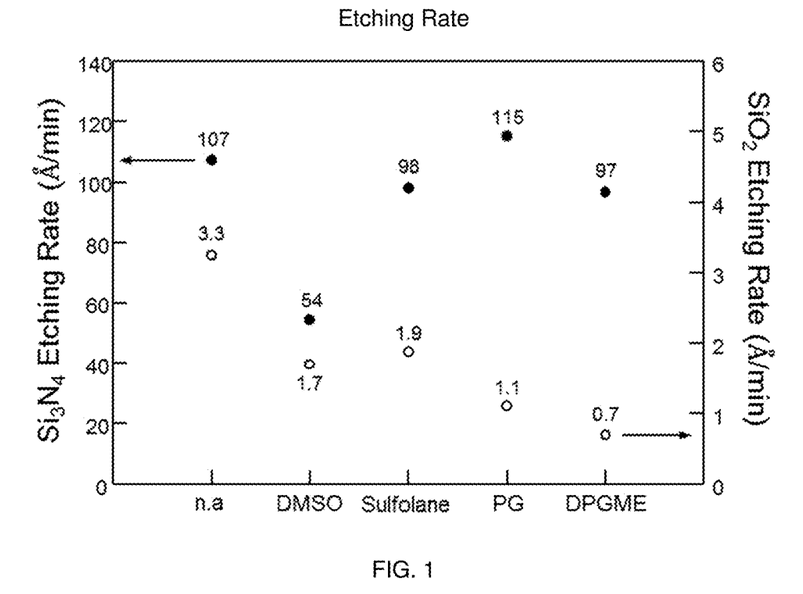
FIG. 1 is a graph illustrating $Si_3N_4$ and $SiO_2$ etch rates for compositions comprising varying types of solvents.
Figure 2:
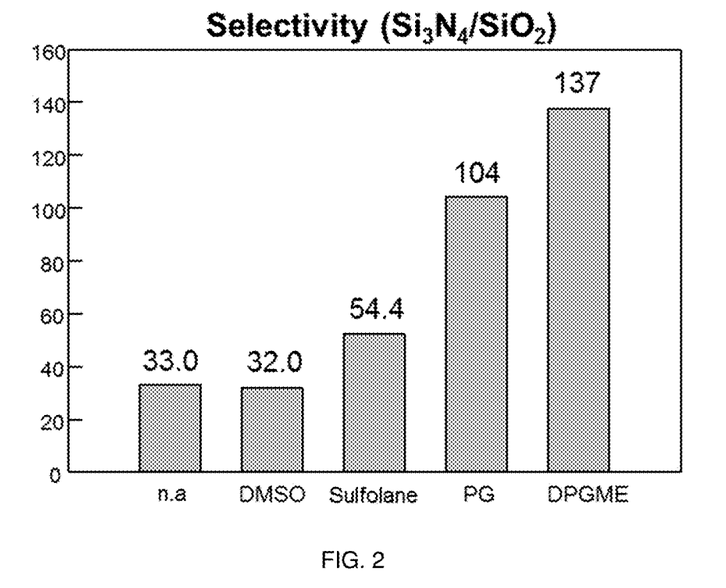
FIG. 2 is a graph illustrating the etch selectivity, $Si_3N_4$/$SiO_2$ for the compositions of FIG. 1.
Figure 3:
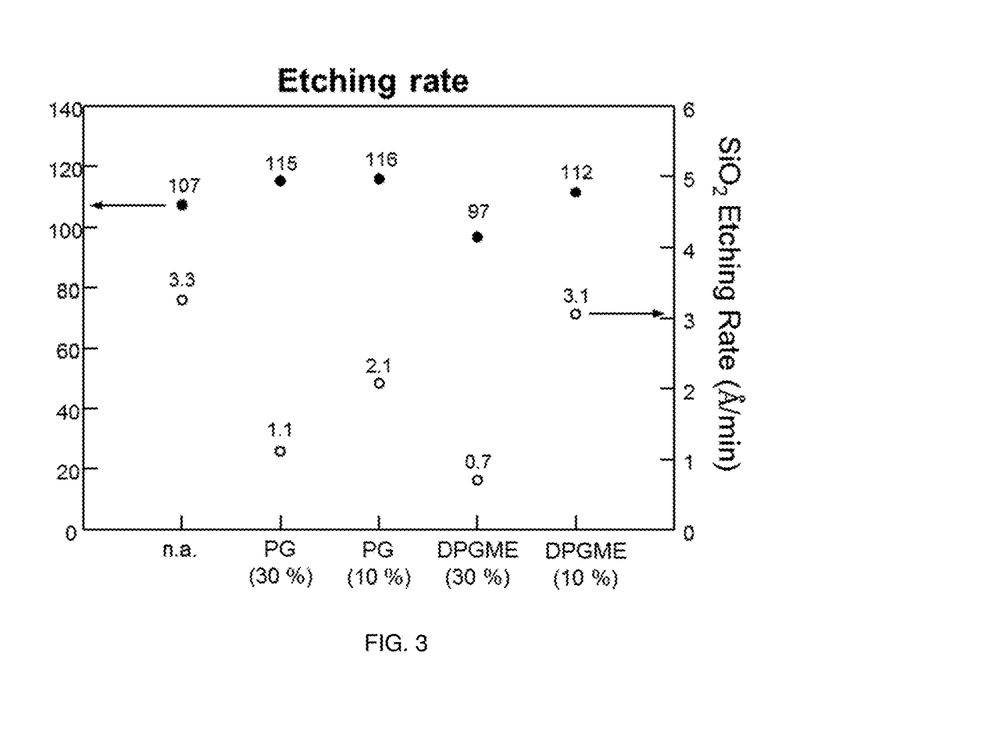
FIG. 3 is a graph illustrating $Si_3N_4$ and $SiO_2$ etch rates for compositions comprising varying types of solvents.
Figure 4:
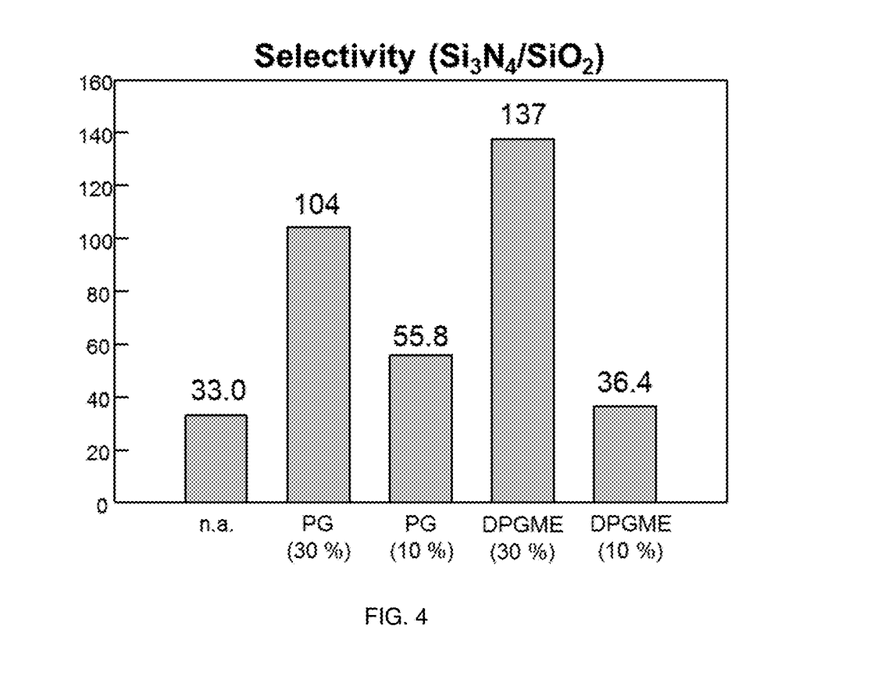
FIG. 4 is a graph illustrating the etch selectivity, $Si_3N_4$/$SiO_2$ for the compositions of FIG. 3.

Four aqueous etching compositions were prepared each comprising 60 wt % phosphoric acid and 30% by volume of (1) DMSO (33 wt %), (2) sulfolane (37.8 wt %), (3) propylene glycol (PG), (31.2 wt %) and (4) dipropylene glycol methyl ether (DPGME), (28.5 wt %) respectfully. The balance of the compositions was water. One composition was made as described above, but without a solvent ("n.a"). That composition was 85 wt % phosphoric acid and the balance was water Referring to FIG. 1 and FIG. 2, the addition of DMSO decreased etch rates of both $Si_3N_4$ and $SiO_2$ without a change in selectivity. The addition of sulfolane further decreased the etch rate of $SiO_2$ with a selectivity increase to 54. The addition of PG and DPGME each of which comprise —OH groups greatly suppressed the etching rate of $SiO_2$ with large increases in selectivity to 104 and 137, respectively. However, when PG and DPGME were added, the etchant became viscous after heating.

Example Set 2

In this example set, the amounts of solvent were varied. Four aqueous etching compositions were prepared each comprising 60 wt % (30 vol %) solvent; and 76.5 wt % (10 vol %) phosphoric acid and either 10% or 30 vol % of (1) propylene glycol (PG) (11 wt % (10 vol %), 33 wt % (30 vol %) and (2) dipropylene glycol methyl ether (PGME) (9.5 wt % (10 vol %) and 28.5 wt % (30 vol %), respectfully. The balance of the compositions was water. One composition was made as above but without a solvent ("n.a").

In this example set, the amounts of solvent were varied. Four aqueous etching compositions were prepared each comprising 60 wt % (30 vol %) solvent; and 76.5 wt % (10 vol %) phosphoric acid and either 10% or 30 vol % of (1) propylene glycol (PG) (11 wt % (10 vol %), 33 wt % (30 vol %) and (2) dipropylene glycol methyl ether (DPGME) (9.5 wt % (10 vol %) and 28.5 wt % (30 vol %), respectfully. The balance of the compositions was water. One composition was made as above but without a solvent ("n.a").

Example Set 3

As another point of comparison, since PG was more effective to lower $SiO_2$ etching rate at 10 vol % (10.4 wt %) than DPGME, HF was added to determine whether etch rates would increase in the presence of PG.

Figure 5:
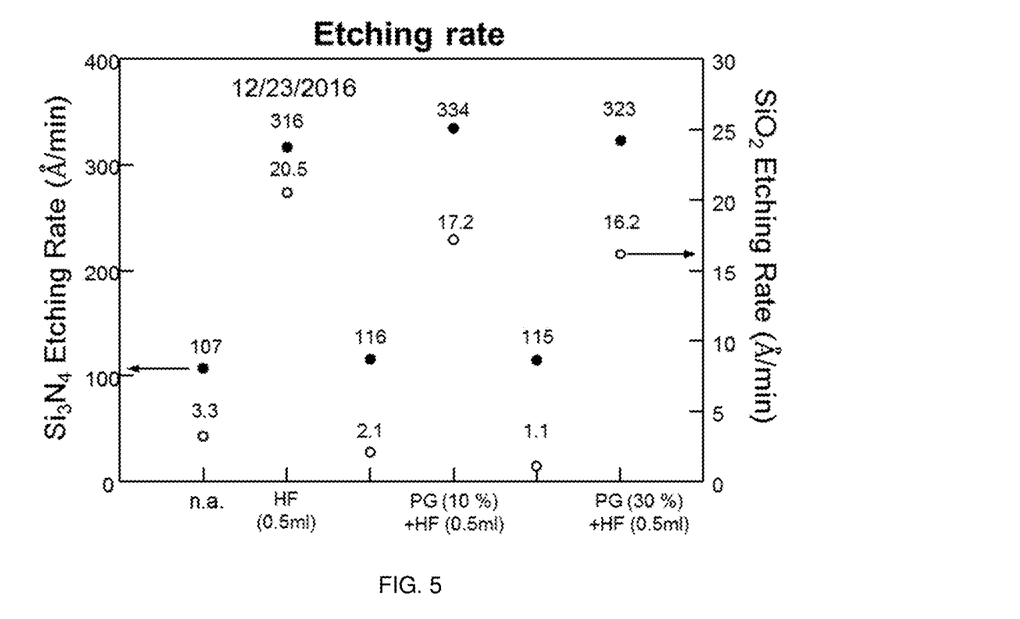
FIG. 5 is a graph illustrating $Si_3N_4$ and $SiO_2$ etch rates for compositions comprising varying types of solvents.
Figure 6:
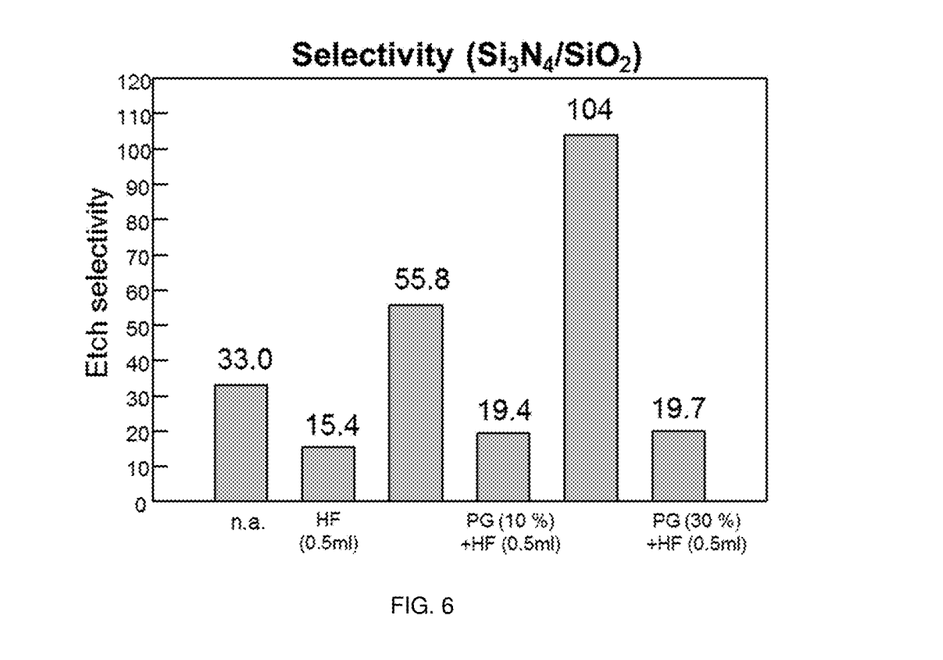
FIG. 6 is a graph illustrating the etch selectivity, $Si_3N_4$/$SiO_2$ for the compositions of FIG. 5.

Referring to FIG. 5 and FIG. 6, etch selectivity of the HF-inclusive compositions increased from 15.4 to 19.7 in the presence of PG, which is not that effective. Overall, however, addition of HF to the $PG/H_3PO_4$ etching compositions greatly reduced the selectivity from 56 to 19 when HF was present at 10 vol % (10.4 wt %), and from 104 to 20 (when present at 30 vol % (31.2 wt %) of the composition.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for the selective removal of silicon nitride over silicon oxide from a microelectronic device, which comprises:
   water;
   phosphoric acid in an amount from about 50% to about 95% by weight; and
   a hydroxyl group-containing solvent selected from the group of (i) from about 0.5% by weight to about 50% by weight of propylene glycol and (ii) from about 1% by weight to about 50% by weight of di-propylene glycol monomethyl ether (DPGME), wherein the solution is substantially free of fluoride ions.

2. The etching solution of claim 1 wherein said water is present in an amount from about 5% to about 30% by weight of the etching solution; wherein said phosphoric acid is present in an amount from about 50% to about 80% by weight of the etching solution; and said hydroxyl group-containing solvent is present in an amount from about 7% to about 40% by weight of the etching solution.

3. The etching solution of claim 2 wherein the hydroxyl group-containing solvent is present in an amount from about 20% to about 40% by weight of the etching solution.

4. The etching solution of claim 1 wherein the hydroxyl group-containing solvent is from about 0.5% by weight to about 50% by weight of propylene glycol.

5. The etching solution of claim 1 wherein the phosphoric acid is present in an amount from about 60% to about 95% by weight of the etching solution.

6. The etching solution of claim 1 wherein the hydroxyl group-containing solvent is from about 1% by weight to about 50% by weight of di-propylene glycol monomethyl ether (DPGME).

7. A method of selectively enhancing the etch rate of silicon nitride relative to silicon dioxide on a composite semiconductor device comprising silicon nitride and silicon dioxide, the method comprising the steps of:
   contacting the composite semiconductor device comprising silicon nitride and silicon dioxide with a composition comprising:
   water;
   phosphoric acid in an amount from about 50% to about 95% by weight; and
   a hydroxyl group-containing solvent selected from the group of (i) from about 0.5% to about 50% by weight of propylene glycol and (ii) from about 1% by weight to about 50% by weight of di-propylene glycol monomethyl ether (DPGME),
   wherein the composition is substantially free of fluoride ions; and
   rinsing the composite semiconductor device after the silicon nitride is at least partially removed, wherein the selectivity of the etch for silicon nitride over silicon oxide is from about 50 to about 500.

8. The method of claim 7 further comprising the step of drying the semiconductor device.

9. The method of claim 7 wherein the selectivity of the etch for silicon nitride over silicon oxide is from about 100 to about 500.

10. The method of claim 7 wherein the selectivity of the etch for silicon nitride over silicon oxide is from about 125 to about 500.

11. The method of claim 7 wherein the contacting step is performed at a temperature of from about 100° C. to about 200° C.

12. The method of claim 7 wherein said water is present in an amount from about 5% to about 30% by weight of the etching solution; said phosphoric acid is present in an amount from about 50% to about 80% by weight of the etching solution; and said hydroxyl group-containing solvent is present in an amount from about 7% to about 40% by weight of the etching solution.

13. The method of claim 12 wherein the hydroxyl group-containing solvent is present in an amount from about 20% to about 40% by weight of the etching solution.

14. The method of claim 7 wherein the hydroxyl group-containing solvent comprises from about 0.5% by weight to about 50% by weight of propylene glycol.

15. The method of claim 7 wherein the phosphoric acid is present in an amount from about 60% to about 95% by weight of the etching solution.

16. The method of claim 7 wherein the hydroxyl group-containing solvent is from about 1% by weight to about 50% by weight of di-propylene glycol monomethyl ether (DPGME).

* * * * *